United States Patent [19]

Yamazaki

[11] Patent Number: 5,647,904
[45] Date of Patent: Jul. 15, 1997

[54] METHOD FOR MANUFACTURING SUPERCONDUCTING CERAMICS IN A MAGNETIC FIELD

[75] Inventor: Shunpei Yamazaki, Tokyo, Japan

[73] Assignee: Semiconductor Energy Laboratory Co., Ltd., Kanagawa-ken, Japan

[21] Appl. No.: 447,520

[22] Filed: May 23, 1995

Related U.S. Application Data

[62] Division of Ser. No. 35,497, Mar. 22, 1993, abandoned, which is a continuation of Ser. No. 541,393, Jun. 21, 1990, abandoned, Division of Ser. No. 246,785, Sep. 20, 1988, Pat. No. 4,956,339.

[30] Foreign Application Priority Data

Sep. 21, 1987 [JP] Japan .................. 63-236961

[51] Int. Cl.$^6$ .................. C30B 15/14
[52] U.S. Cl. .................. 117/32; 117/12; 117/208
[58] Field of Search .................. 117/13, 32, 36, 117/208; 505/1, 729

[56] References Cited

U.S. PATENT DOCUMENTS

| | | | |
|---|---|---|---|
| 3,640,865 | 2/1972 | Burns et al. | 117/3 |
| 4,071,323 | 1/1978 | Holman | 156/DIG. 83 |
| 4,565,671 | 1/1986 | Matsutani et al. | 156/617.1 |
| 4,622,211 | 11/1986 | Suzuki et al. | 422/249 |
| 4,664,744 | 5/1987 | Le Gal et al. | 156/616.1 |
| 4,956,336 | 9/1990 | Yamazaki | 505/1 |
| 5,079,218 | 1/1992 | Tanaka et al. | 505/1 |
| 5,112,802 | 5/1992 | Takano et al. | 505/1 |
| 5,140,004 | 8/1992 | Tanaka et al. | 505/1 |
| 5,232,909 | 8/1993 | Takano et al. | 505/1 |
| 5,268,061 | 12/1993 | Sunwoo et al. | 156/608 |

FOREIGN PATENT DOCUMENTS

| | | | |
|---|---|---|---|
| 0263310 | 12/1988 | Germany | 156/617.1 |
| 0033293 | 2/1985 | Japan | 156/DIG. 115 |
| 0081086 | 2/1985 | Japan | 156/DIG. 115 |
| 3095195 | 4/1988 | Japan | 156/617.1 |
| 1083591 | 3/1989 | Japan | 422/249 |
| 0993880 | 6/1965 | Netherlands | 156/617.1 |

OTHER PUBLICATIONS

"Single Crystal Growth of $(La_{y-x}A_x)_2 CuO_4$ (A=Ba or Sr) And $(Ba_2 YCu_3O_{7-y})$", Hidaka et al., *Journal of Crystal Growth*. 85 (1987) pp. 581–584.

"Low Oxygen Content Czochralski Silicon Crystal Growth", Hoshikawa et al.; vol. 19, No. 1, Jan. 1, 1980; *Japanese J. Applied Physics*.

*Primary Examiner*—R. Bruce Breneman
*Assistant Examiner*—Felisa Garrett
*Attorney, Agent, or Firm*—Sixbey, Friedman, Leedom & Ferguson, P.C.; Gerald J. Ferguson, Jr.

[57] ABSTRACT

A method and an apparatus for fabricating single crystals of superconducting ceramics are described. A powdered row oxide mixture is placed and molten in a melting pot. The surface of the molten mixture is approximately at the freezing point of the mixture. From the surface, a single crystal is pulled in accordance with the known pulling crystal technique. The pulled mixture is subjected to a magnetic field normal to the pulling direction. By virtue of the magnetic field, single crystal superconducting oxide ceramics can be obtained without twin crystals.

4 Claims, 2 Drawing Sheets

$(IIa\ IIa_2)Cu_3\ O_{7-x}$

METHOD FOR MANUFACTURING SUPERCONDUCTING CERAMICS IN A MAGNETIC FIELD

This application is a divisional of Ser. No. 08/035,497, filed Mar. 22, 1993, now abandoned; which itself is a continuation of Ser. No. 07/541,393, filed Jun. 21, 1990, abandoned; which itself is a divisional of Ser. No. 06/246,785 filed Sep. 20, 1988, now U.S. Pat. No. 4,956,339.

BACKGROUND OF THE INVENTION

This invention generally relates to the field of superconducting ceramics and particularly to manufacturing methods for making superconducting ceramics in a magnetic field and manufacturing apparatuses for the same.

It has long been known that metals such as mercury and lead, intermetallics such as NbNd, $Nb_3Ge$ and NbGa and ternary materials such as $Nb_3(Al_{0.8}Ge_{0.2})$ demonstrate superconductivity. However, the transition temperature, Tc onset, of such long known conventional superconducting materials cannot exceed 25° K.

In more recent years, superconducting ceramics have attracted widespread interest. A new material was first reported by researchers at the Zurich laboratory of IBM Corp. as Ba—La—Cu—O-type high temperature superconducting oxides. Subsequently, La—Sr—Cu(II)—O-type superconducting oxides were also proposed. Other types of superconducting materials have been found in general form $YBa_2Cu_3O_{6-8}$. It has not been successed hitherto to obtain a superconducting ceramic material having a high Tc higher than 30° K. by a method in which a mixture of chemicals in a suitable composition is compacted and fired. These superconducting ceramics form a quasi-molecular atomic unit in a perovskite-like structure whose unit cell is constructed with one layer in which electrons have essentially one-dimensional motion, whereas a number of crystalline grains are arranged at randam with diverse crystalline directions, and therefore the critical current density is substantially limited.

Because of this, it is earnestly desired to elevate Tco, the temperature at which resistance vanishes, above the levels previously obtained and preferably above the boiling point of nitrogen (77° K.) or even higher and also to increase critical current densities. In order to solve such shortcomings of prior arts, we have proposed an improved method, as described in our Japanese Patent Application No. sho62-75205 filed on Mar. 27, 1987, entitled "Manufacturing Method of superconducting Materials." The present invention relates to the further improvement and advancement of our previous invention for applying it to methods of making thin films of superconducting oxide materials.

OBJECTS AND SUMMARY OF THE INVENTION

It is therefore an object of the invention to provide a method of manufacturing superconducting ceramics having a higher transition temperature (nearly room temperature) than hitherto and to provide an apparatus for manufacturing such superconducting ceramics suitable for mass-production at relatively low costs.

It is another object of the present invention to provide a method and an apparatus for manufacturing large sized single crystals of superconducting ceramics without producing twin crsytals.

In accordance with the present invention, a superconducting material grows from a melting raw mixture in a direction perpendicular to the C plane, preferably along the b axis by virtue of a magnetic field approximately parallel with the growing direction (at least within ±15°). The raw mixture is molten in a melting pot and aggitated in order to avoid the melting mixture nonuniform in which the proportion of the heavier constituent comprising a rare earth element is larger at a low position. The aggitation is performed effectively by rotating the direction of the magnetic field applied to the melting mixture which is a magnetic fluid. The strength of the applied magnetic field is no weaker than 0.1 T, preferably 0.5 to 5.0 T. The magnetic field expedites the uniform crystalline growth of a superconducting material. It is also possitive factor for growing a uniform crystalline structure that the crystalline mixture grows necessarily at a high temperature at 400° C. to 1150° C., for example 600° C. to 900° C. According to experimental, the critical current density was measured to be $1\times10^5$ $A/cm^2$. When the aggitation is performed in the vertical direction, diamagnetism can be observed.

The method according to the present invention facilitates adjustment of the composition by arbitrarily changing prescribed amounts of constituent chemicals. Also, the length of a single crystal grown according to the present invention reaches as long as 50 cm from conventional several millimeters. The breadth and thickness may be more flexibly controlled by skilled persons according to the invention in comparison with the prior art technique.

Superconducting materials are constructed in perovskite-like structures as illustrated in FIG. 1 in accordance with the present invention. The structure comprises copper atoms 2, an intervening copper atom 3, oxygen atoms 5 and 6 surrounding the copper atoms, oxygen vacancies 7, atoms 1 belonging to Group IIIa of the periodic table such as Y, and atoms 4 belonging to Group IIa such as Ba. The superconduction in such a structure may be explained on the grounds that electron pairs are drifted along the layer planes of the layered structures consisting of the oxygen atoms 5 and the central copper atoms 2 (the plane made of a and b axes, i.e. the c plane) by virtue of the interaction between the oxygen and copper atoms. Furthermore, the most successful theory of pairing of electrons was the BCS theory, in accordance with which the pairing might be established by mediation of phonons. The inventor, however, confirmed that electron pairs each consisting of electrons having opposite spins are mediated by the quantum associated with the interaction between the rare earth element 1 (screw magnetic substance) and the oxygen vacancy 7, called "magnon." The magnon is regarded to function as a key quasi-particle which allow electron pairs to pass along the layered structure.

As apparently understood the foregoing explanation, the magnetic field plays important role in establishing superconduction. In response to a magnetic field, the melting mixture exhibits electromagnetic behavour in accordance with a diamagnetic effect. The mixture is aggitated by rotating the direction of a magnetic field applied thereto. Besides the rotating magnetic field, oxygen supply into the melting mixture expedites aggitation as well as oxidation thererof.

Furthermore, the critical current densities along the C plane are larger than those normal to the C plane by two or much orders of magnitude. Because of this, it is very important to align crystalline directions within the superconducting ceramics.

Other feature of the invention are set forth with particularity in the appended claims and will become clear to those possessed of the relevant skills from consideration of the following description of exemplary embodiments.

DETAILED DESCRIPTION OF THE PREFERRED EMBODIMENT

Described hereinafter are several examples illustrating the manufacture by a method according to the present invention of superconducting ceramics conforming to the stoichiometric formulae $(A_{1-x}B_x)_yCu_zO_w$, where A is one or more elements of Group IIIa of the Periodic Table, e.g., the rare earth elements, B is one or more elements of Group IIa of the Japanese Periodic Table, e.g., the alkaline earth metals including beryllium and magnesium, and x=0.1–1; y=2.0–4.0, preferably 2.5–3.5; z=1.0–4.0, preferably 1.6–3.5; and w=4.0–10.0, preferably 6.0–8.0.

Prescribed amounts of $BaCO_3$, $SrCO_3$, CuO, $Yb_2O_3$ and $Y_2O_3$ (High Purity Chemical Industries Co. Ltd. 99.95% or higher) were used for preparing a superconducting ceramic material of the above formula in consistence with $(Y_{0.5}Yb_{0.5}BaSr)Cu_3O_{6-8}$. The factor "w" was controlled by adjusting the sintering condition.

After being mixed in a ball mill, the high purity chemicals were pressed in a capsule at 100 Kg/cm and formed into a cylindrical shaped tablet of 25 mm diameter and 3 mm height. The tablet was heated (fired) and oxidized at 500°–1400° C., e.g., 950° C. for 8 hours in an oxdizing atmosphere such as in air, this step being called pre-firing hereinafter. The fired tablet is then ground to obtain a powdered mixture of superconducting raw ceramics.

Figure 1:
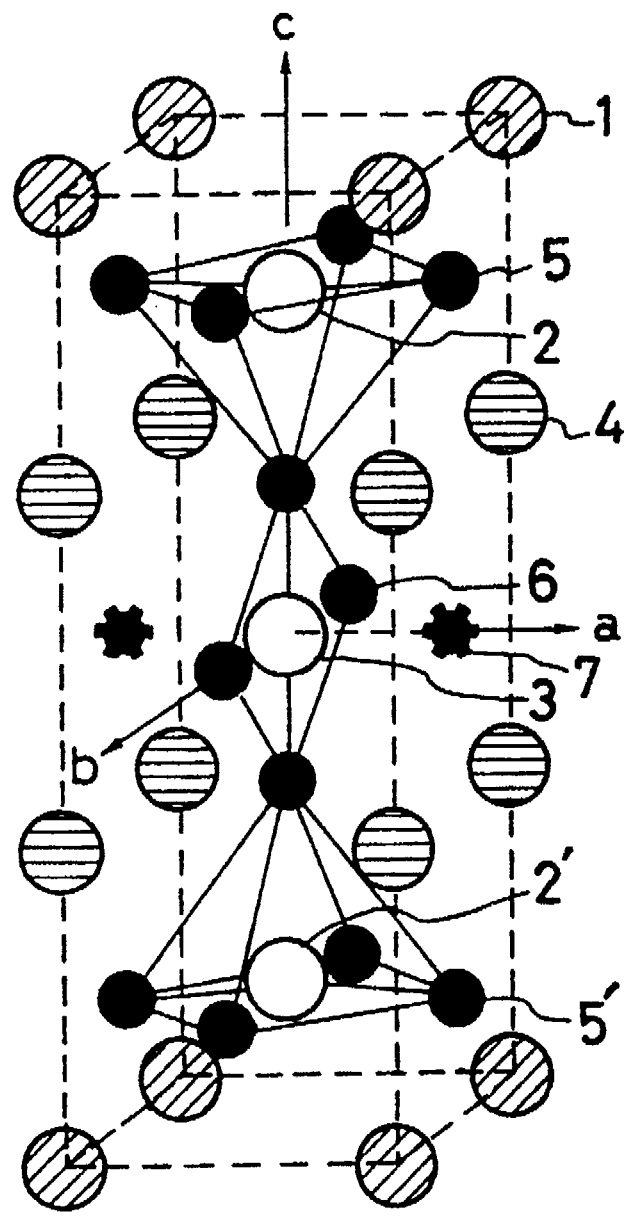
FIG. 1 is a schematic diagram showing the configuration of the perovskite-like molecular sturcture in accordance with the present invention.
Figure 1:
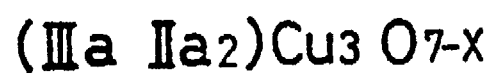
Figure 2A:
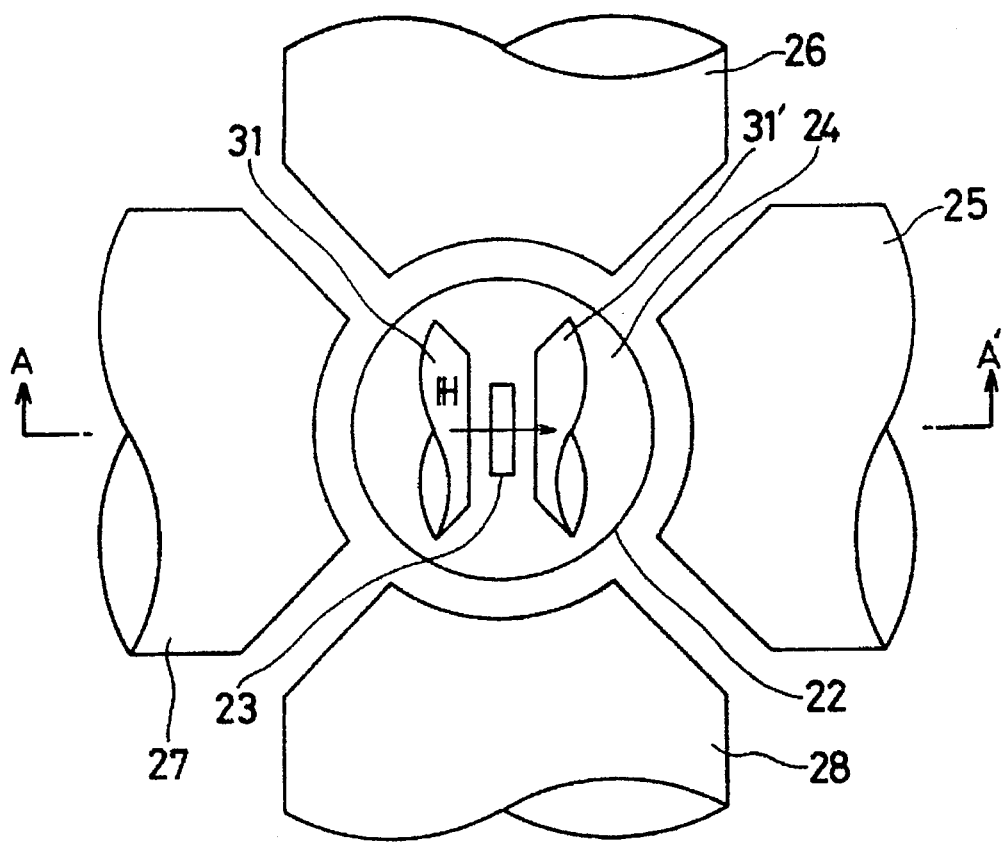
FIGS. 2(A) and 2(B) are top and side sectional views showing an apparatus for manufacturing superconducting ceramics in accordance with the present invention.
Figure 2B:
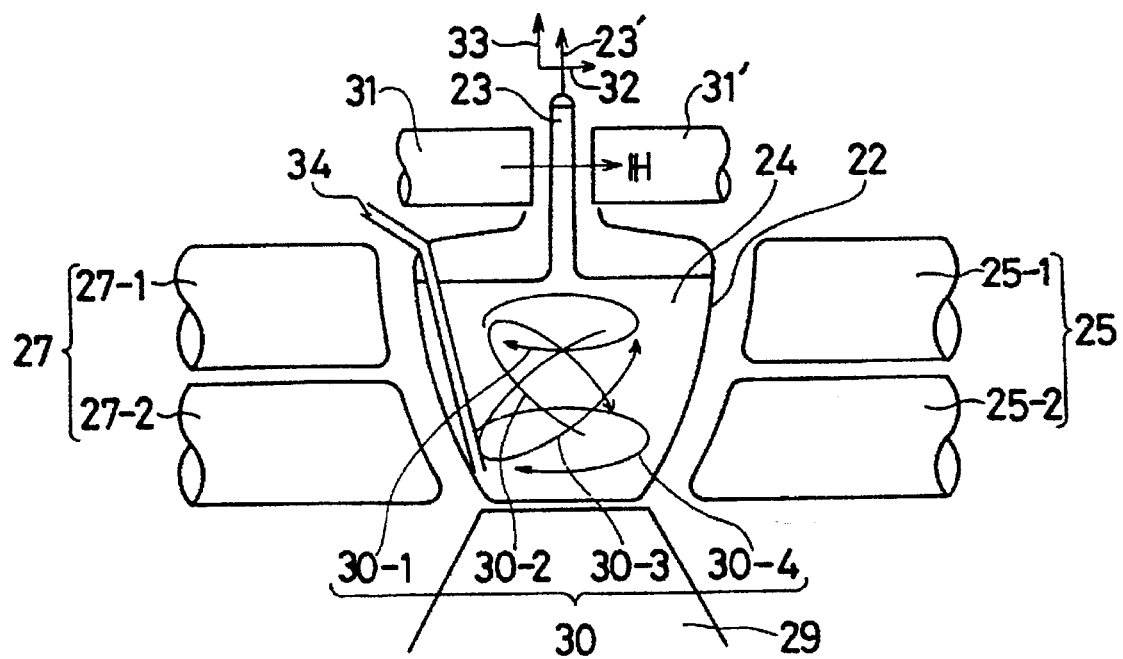

FIG. 2 is a schematic diagram showing an apparatus for manufacturing superconducting ceramics. The apparatus comprises a melting pot 22 made of platinum for retaining a raw mixture of superconducting ceramics, a heater 29 for heating the melting pot mounted thereon, four magnet pairs 25, 26, 27 and 28 located surrounding the pot 22, an inlet port 34 and opposed magnets 31 and 31' located just above the melting pot 22. Out of the surrounding magnets 25 to 28, two opposed magnets are activated in opposite phases in order that melting mixture contained in the pot is subjected to a magnetic field in a lateral direction.

The superconducting raw material is placed in the melting pot and molten at 1400° C. A magnetic field is applied to the melting material at 1 T by means of the magnets surrounding the melting pot. By sequentially activating and switching the magnets 25 to 28 in order, the direction of the magnetic field is rotated at 1 rotation per second and by virtue of which the melting material is aggitated. The powdered mixture of raw superconducting ceramics is supplied to the melting pot together with oxygen via the inlet port. The supplied oxygen oxidizes the melting mixture and expedites the aggitation thereof. A single crystalline superconducting belt is formed from the melting mixture by the crystal pulling technique, while at the same time the mixture is gradually cooled to 250° C. during pulling. The melting pot is rotated in the direction opposite to the rotation direction of the magnetic field. The superconducting belt is subjected to a magnetic field during pulling between the opposed magnets 31 and 31' at 0.1 to 1.0 T, e.g. 0.3 T. The portion of the belt just subjected to the magnetic field is at no lower than 400° C. The magnetic field induced by the opposed magnets may be alternating or DC field. The pulling speed of the superconducting belt is 10 mm/hour in case of a cooling rate of about 10° C./hour. Reference numeral 23' designates the direction of pulling; reference numeral 32 designates the normal direction to the c axis; and reference numeral 33 designates the direction normal to the C plane. Of course, the seed crystal should be oriented in accordance with the design of the crystal pulling technique. In accordance with the experiments, single crystalline superconducting belts were obtained with a length of 50 cm or larger, a width of 1 cm or wider and a thickness of 1 mm or thicker. These dimensions can be controlled by adjusting the surface temperature of the melting material and the pulling speed of the crystal. The Tc onset was measured to be 99° K. The Tc was measured to be 98° K. The critical current density was measured at 77° K. to be $2.8 \times 10^6$ $A/cm^2$.

Alternatively, the apparatus can be modified such that the configuration is just turned at a right angle. The amount of melting mixture is halved in order to be kept in the pot by virtue of the magnetic field induced by the magnets. In this case, the growing direction of crystalline structure is aligned with the b axis which is a horizontal direction. A superconducting belt is pulled from a vertical surface of the melting mixture. The Tco was measured to be 97° K. and the critical current was measured to be $2 \times 10^6$ $A/cm^2$ at 77° K.

The foregoing Examples are merely illustrative of the invention, and do not include all of the combinations of elements and process variations which may be used to produce superconducting ceramic material in accordance with the invention, other combinations also being effective to provide improved superconducting materials.

Superconducting ceramics for use in accordance with the present invention also may be prepared in consistence with the stoichiometric formulae $(A_{1-x}B_x)_yCu_zO_wX_v$, where A is one or more elements of Group IIIa of the Periodic Table, e.g., the rare earth elements, B is one or more elements of Group IIa of the Periodic Table, e.g., the alkaline earth metals including beryllium and magnesium, X is one or more elements of a group consisting of Ge, Sn, Pb, F and Cl, and x=0–1; y=2.0–4.0, preferably 2.5–3.5; z=1.0–4.0, preferably 1.5–3.5; w=4.0–10.0, preferably 6.0–8.0; and v=0–3. Also, superconducting ceramics for use in accordance with the present invention may be prepared consistent with the stoichiometric formulae $(A_{1-x}B_x)_yCu_zO_w$, where A is one or more elements of Group Vb of the Priodic Table such as Bi, Sb and As, B is one or more elements of Group IIa of the Periodic Table, e.g., the alkaline earth metals including beryllium and magnesium, and x=0.3–1; y=2.0–4.0, preferably 2.5–3.5; z=1.0–4.0, preferably 1.5–3.5; and w=4.0–10.0, preferably 6.0–8.0. Examples of this general formula are $BiSrCaCuCu_2O_x$ and $Bi_4Sr_3Ca_3Cu_4O_x$. Tc onset and Tco samples in consistent with the formula $Bi_4Sr_3Ca_3Cu_4O_x$ (y is around 1.5) were measured to be 40°–60° K., which is not so high. Relatively high critical temperatuers were obtained with samples conforming to the stoichiometric formulae $Bi_4Sr_4Ca_2Cu_4O_x$ and $Bi_2Sr_3Ca_2Cu_2O_x$. The number x denoting the oxygen proportion is 6–10, e.g. around 8.1. Such superconducting materials can be formed by screen press printing, vacuum evaporation or CVD.

While a description has been made for several embodiments, the present invention should be limited only by the appended claims and should not be limited by the particular examples. The present invention is applicable to superconducting coils, SQUIDs, Josephson devices, or other superconducting devices.

In this description, Group IIIa is directed to a group consisting of transition elements as shown in "Phisics and Chemistry Dictionary" published by Iwanami, Japan. In this connection, Group IIIa consists of typical elements in "The Penguin Dictionary of Science" published by Penguin Books.

I claim:

1. A method for forming an oxide superconducting material comprising the steps of:

introducing a raw material for forming an oxide superconducting material into a platinum crucible:

heating said raw material to a melting temperature thereof so that the raw material is transformed into a molten state;

placing a seed crystal in said melted raw material;

pulling said seed crystal so that crystals of said oxide material grown thereon; and supplying oxygen to said crucible to form the oxide superconducting material.

2. A method for forming an oxide superconducting material comprising the steps of:

introducing a raw material for forming an oxide superconducting material into a platinum crucible;

heating said raw material to a melting temperature thereof so that the raw material is transformed into a molten state;

placing a seed crystal in said melted raw material;

pulling said seed crystal so that crystals of said oxide material grown thereon; and inducing and rotating a magnetic field within said crucible.

3. The method of claim 2 wherein the magnetic field inducing and rotating step varies the direction of said magnetic field in a plane perpendicular to an axis of said rotation.

4. A method for forming an oxide superconducting material comprising the steps of:

introducing a raw material for forming an oxide superconducting material in a platinum crucible;

heating said raw material to a melting temperature thereof so that the raw material is transformed into a molten state; and gradually cooling said melted raw material to form a superconducting oxide crystal.

* * * * *